United States Patent
Koh et al.

(10) Patent No.: US 11,532,504 B2
(45) Date of Patent: *Dec. 20, 2022

(54) LOW-RESISTANCE CONTACT PLUGS AND METHOD FORMING SAME

(71) Applicant: Taiwan Semiconductor Manufacturing Co., Ltd., Hsinchu (TW)

(72) Inventors: Shao-Ming Koh, Hsinchu (TW); Chen-Ming Lee, Yangmei (TW); Fu-Kai Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/985,555

(22) Filed: Aug. 5, 2020

(65) Prior Publication Data

US 2020/0365450 A1 Nov. 19, 2020

Related U.S. Application Data

(60) Division of application No. 16/214,722, filed on Dec. 10, 2018, now Pat. No. 10,741,438, which is a
(Continued)

(51) Int. Cl.
*H01L 29/165* (2006.01)
*H01L 21/768* (2006.01)
(Continued)

(52) U.S. Cl.
CPC .... *H01L 21/76805* (2013.01); *H01L 21/0332* (2013.01); *H01L 21/283* (2013.01);
(Continued)

(58) Field of Classification Search
CPC .......... H01L 21/76805; H01L 21/0332; H01L 21/283; H01L 21/76837; H01L 21/76895;
(Continued)

(56) References Cited

U.S. PATENT DOCUMENTS 5,905,294 A 5/1999 Kushida
7,109,080 B2 9/2006 Lee et al.
(Continued)

FOREIGN PATENT DOCUMENTS

CN 106457288 A 2/2017
JP H09205198 A 8/1997
(Continued)

*Primary Examiner* — Timor Karimy
(74) *Attorney, Agent, or Firm* — Slater Matsil, LLP

(57) ABSTRACT

A method includes forming a first and a second contact opening to reveal a first and a second source/drain region, respectively, forming a mask layer having a first and a second portion in the first and the second contact openings, respectively, forming a first and a second sacrificial ILD in the first and the second contact openings, respectively, removing the first sacrificial ILD from the first contact opening, filling a filler in the first contact opening, and etching the second sacrificial ILD. The filler protects the first portion of the mask layer from being etched. An ILD is formed in the second contact opening and on the second portion of the mask layer. The filler and the first portion of the mask layer are removed using a wet etch to reveal the first contact opening. A contact plug is formed in the first contact opening.

20 Claims, 21 Drawing Sheets

Related U.S. Application Data continuation of application No. 15/482,028, filed on Apr. 7, 2017, now Pat. No. 10,153,198.

(51) Int. Cl.
| | |
|---|---|
| *H01L 21/8234* | (2006.01) |
| *H01L 27/088* | (2006.01) |
| *H01L 21/033* | (2006.01) |
| *H01L 29/66* | (2006.01) |
| *H01L 21/283* | (2006.01) |
| *H01L 29/78* | (2006.01) |
| *H01L 21/285* | (2006.01) |

(52) U.S. Cl.
CPC .. *H01L 21/76837* (2013.01); *H01L 21/76895* (2013.01); *H01L 21/76897* (2013.01); *H01L 21/823431* (2013.01); *H01L 21/823475* (2013.01); *H01L 27/0886* (2013.01); *H01L 29/66545* (2013.01); *H01L 21/28518* (2013.01); *H01L 21/76834* (2013.01); *H01L 21/823425* (2013.01); *H01L 29/165* (2013.01); *H01L 29/665* (2013.01); *H01L 29/7848* (2013.01)

(58) Field of Classification Search
CPC ....... H01L 21/76897; H01L 21/823431; H01L 21/823475; H01L 21/28518; H01L 21/76834; H01L 21/823425; H01L 29/66545; H01L 29/165; H01L 29/665; H01L 29/7847; H01L 27/0886
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,455,227 B1 | 9/2016 | Hung et al. | |
| 10,188,192 B2 | 1/2019 | Rabe et al. | |
| 2008/0067590 A1 | 3/2008 | Mise et al. | |
| 2008/0157160 A1 | 7/2008 | Chan | |
| 2013/0065371 A1 | 3/2013 | Wei et al. | |
| 2013/0075821 A1 | 3/2013 | Baars et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0014788 A1* | 1/2015 | Park | H01L 29/66795 257/401 |
| 2015/0228776 A1 | 8/2015 | Xie | |
| 2015/0255275 A1 | 9/2015 | Huang et al. | |
| 2015/0364326 A1 | 12/2015 | Xie et al. | |
| 2016/0071953 A1 | 3/2016 | Mountsier et al. | |
| 2016/0329406 A1 | 11/2016 | Fu et al. | |
| 2016/0351566 A1 | 12/2016 | Niimi et al. | |
| 2016/0365426 A1 | 12/2016 | Ching et al. | |
| 2017/0077097 A1* | 3/2017 | Dong | H01L 29/785 |

FOREIGN PATENT DOCUMENTS

| | | |
|---|---|---|
| KR | 20050073859 A | 7/2005 |
| KR | 20060058576 A | 5/2006 |

\* cited by examiner

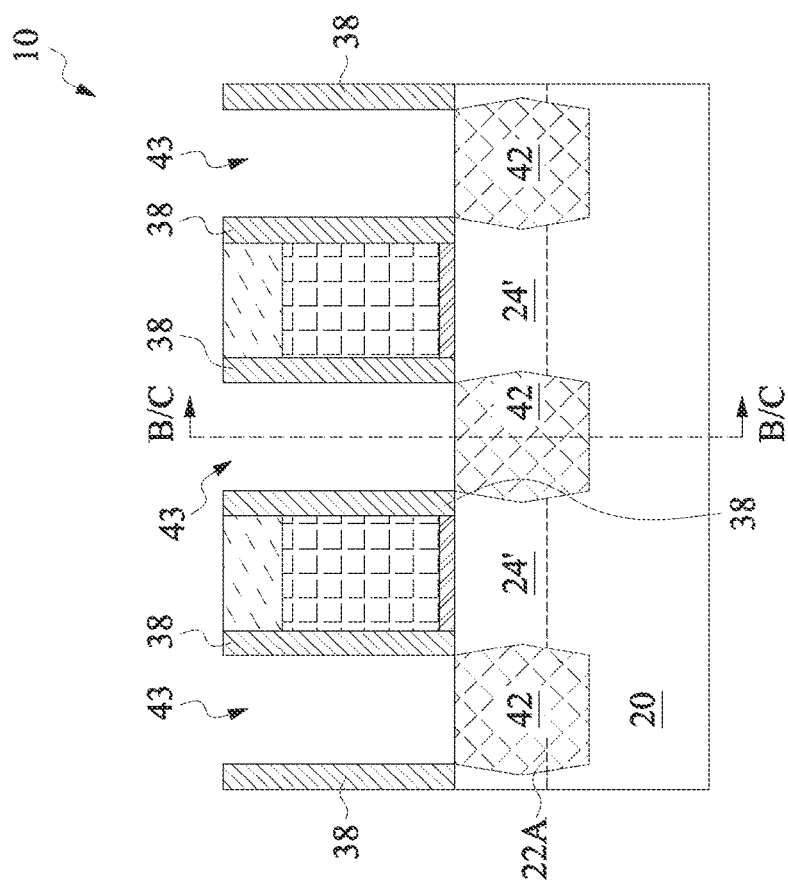
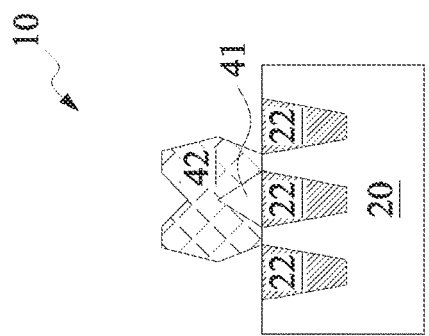
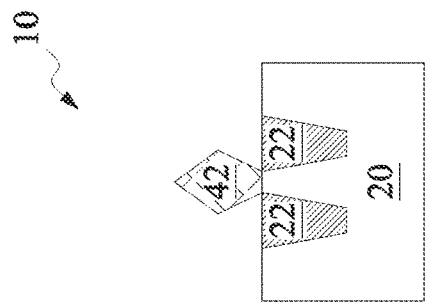
Fig. 6A
Fig. 6B
Fig. 6C

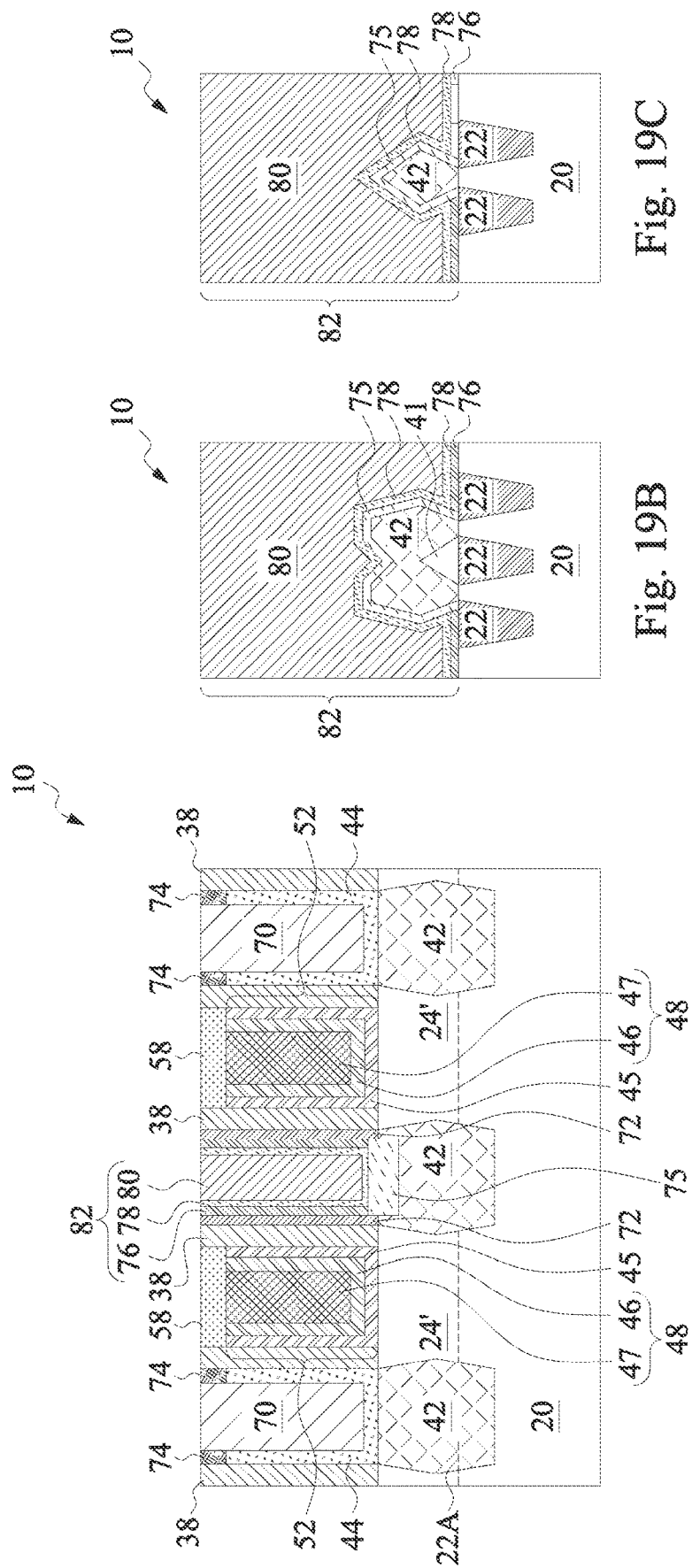

LOW-RESISTANCE CONTACT PLUGS AND METHOD FORMING SAME

PRIORITY CLAIM AND CROSS-REFERENCE

This application is a divisional of U.S. patent application Ser. No. 16/214,722, entitled "Low-Resistance Contact Plugs and Method Forming Same," and filed Dec. 10, 2018, which is a continuation of U.S. patent application Ser. No. 15/482,028, entitled "Low-Resistance Contact Plugs and Method Forming Same," and filed Apr. 7, 2017, now U.S. Pat. No. 10,153,198 issued Dec. 11, 2018, which applications are hereby incorporated herein by reference.

BACKGROUND

In integrated circuits, contact plugs are used for connecting to the source and drain regions, which may be formed through epitaxy. The source/drain contact plugs are typically connected to source/drain silicide regions. The formation of the source/drain silicide regions includes forming contact openings by etching dielectric layers covering the source/drain regions, wherein the etched dielectric layers may include a silicon nitride layer and an oxide layer over the silicon nitride layer. The source/drain regions are thus exposed to the contact openings. An additional silicon nitride layer is formed conformally to cover the sidewalls and the bottoms of the contact openings. A second etching step is then performed to remove the bottom portions of the silicon nitride layer to reveal the epitaxy source/drain regions. A metal layer is then formed to extend into the contact openings, and an anneal is performed to react the metal layer with the source/drain regions, resulting in source/drain silicide regions to be formed. The remaining portions of the contact openings are then filled with a metal(s) to form the source/drain contact plugs.

In conventional processes for forming the contact openings, the etching of various dielectric layers to expose the source/drain regions results in the loss of highly-doped epitaxy source/drain regions. Specifically, the topology of the epitaxy source/drain regions may be lost, and the top surfaces of the epitaxy source/drain regions become flatter, resulting in the area of the source/drain silicide regions to be smaller. The loss of highly doped epitaxy source/drain regions, together with reduced contact area, increases the contact resistance of the source/drain regions. This impacts circuit speed and performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20 are perspective views and cross-sectional views of intermediate stages in the formation of a transistor in accordance with some embodiments.

DETAILED DESCRIPTION

Figure 1:
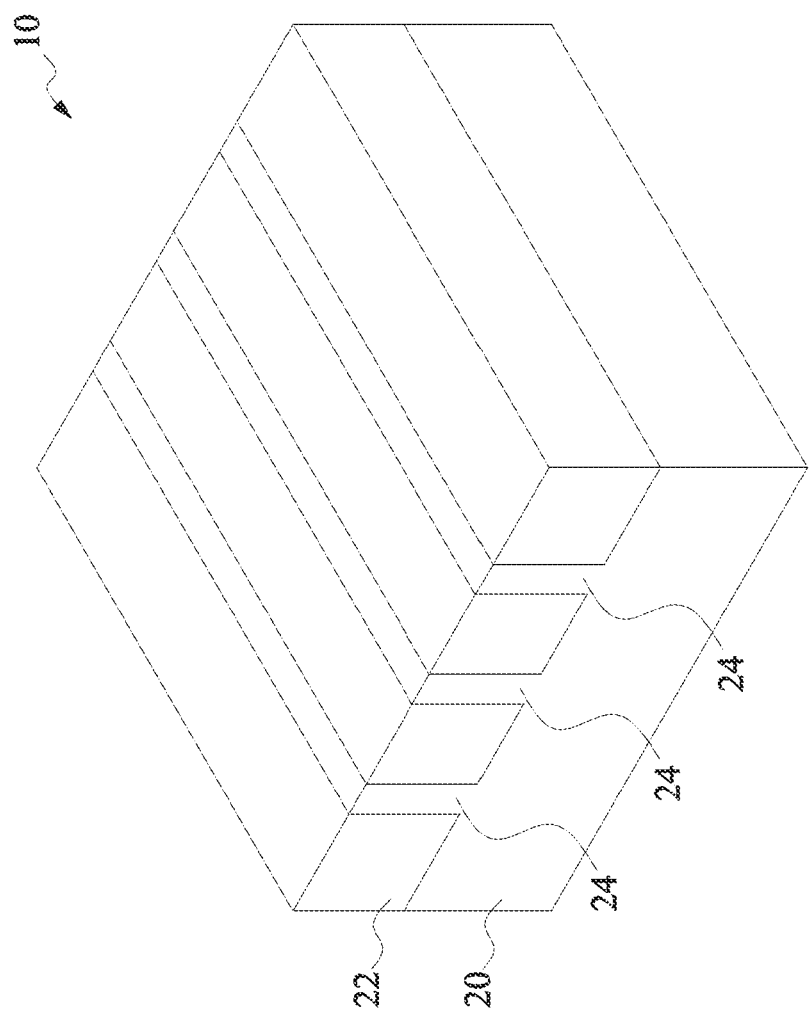

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors, however, may also adopt the concept of the present disclosure.

FIGS. 1 through 20 illustrate the cross-sectional views and perspective views of intermediate stages in the formation of FinFETs in accordance with some embodiments of the present disclosure. The steps shown in FIGS. 1 through 20 are also reflected schematically in the process flow 200 shown in FIG. 21.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 also include a dielectric material over the liner oxide, wherein the dielectric material may be formed using Flowable Chemical Vapor Deposition (FCVD), spin-on coating, or the like.

Figure 2:
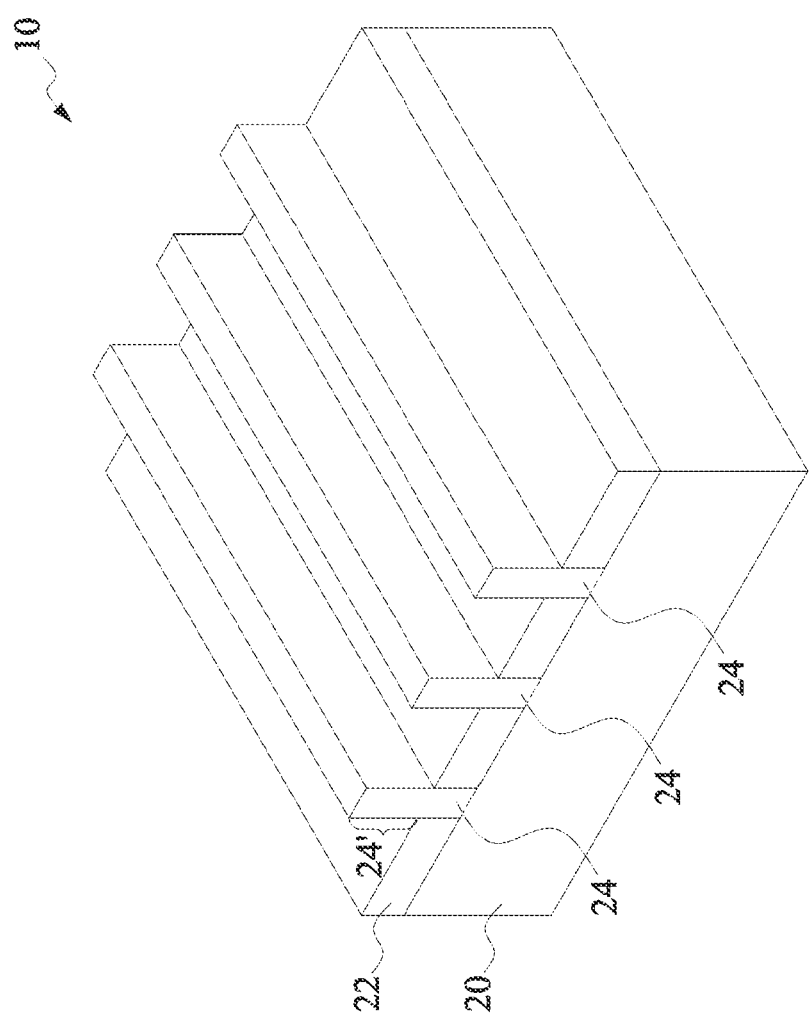

Referring to FIG. 2, STI regions 22 are recessed, so that the top portions of semiconductor strips 24 protrude higher than the top surfaces of STI regions 22 to form protruding fins 24'. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
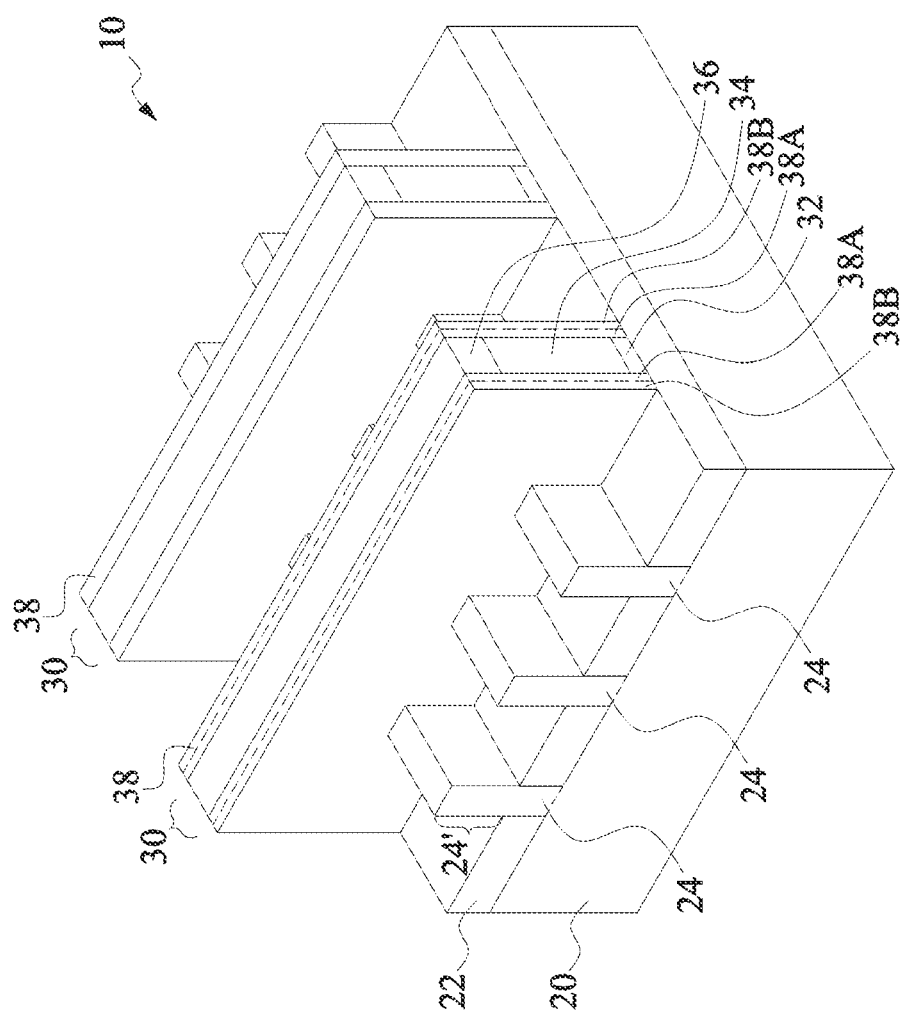

Referring to FIG. 3, dummy gate stacks 30 are formed on the top surfaces and the sidewalls of (protruding) fins 24'. The respective step is shown as step 202 in the process shown in FIG. 21. Dummy gate stacks 30 are parallel to each other, with the plurality of dummy gate stacks crossing the same semiconductor fin(s) 24'. Dummy gate stacks 30 may include dummy gate dielectrics 32 and dummy gate electrodes 34 over dummy gate dielectrics 32. Dummy gate dielectrics 32 may be formed of silicon oxide, and dummy gate electrodes 34 may be formed of, for example, polysilicon. Each of dummy gate stacks 30 may also include one (or a plurality of) hard mask layer 36 over the respective dummy gate electrodes 34. Hard mask layers 36 may be formed of silicon nitride, silicon carbo-nitride, or the like. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon carbon-oxynitride (SiCN), silicon nitride, or the like, and may have a single-layer structure or a multi-layer structure including a plurality of dielectric layers.

In accordance with some embodiments, each of gate spacers 38 includes a low-k dielectric layer 38A and a non-low-k dielectric layer 38B, with each of layers 38A and 38B formed through a blanket deposition step followed by an anisotropic etching step. Low-k dielectric layer 38A may be formed of a low-k dielectric material having a dielectric constant (k value) lower than about 3.0 or lower than about 2.5, which may be formed of SiON or SiOCN, with pores formed therein in order to have the desired low-k value. Non-low-k dielectric layer 38B may be formed of silicon nitride, for example.

Figure 4:
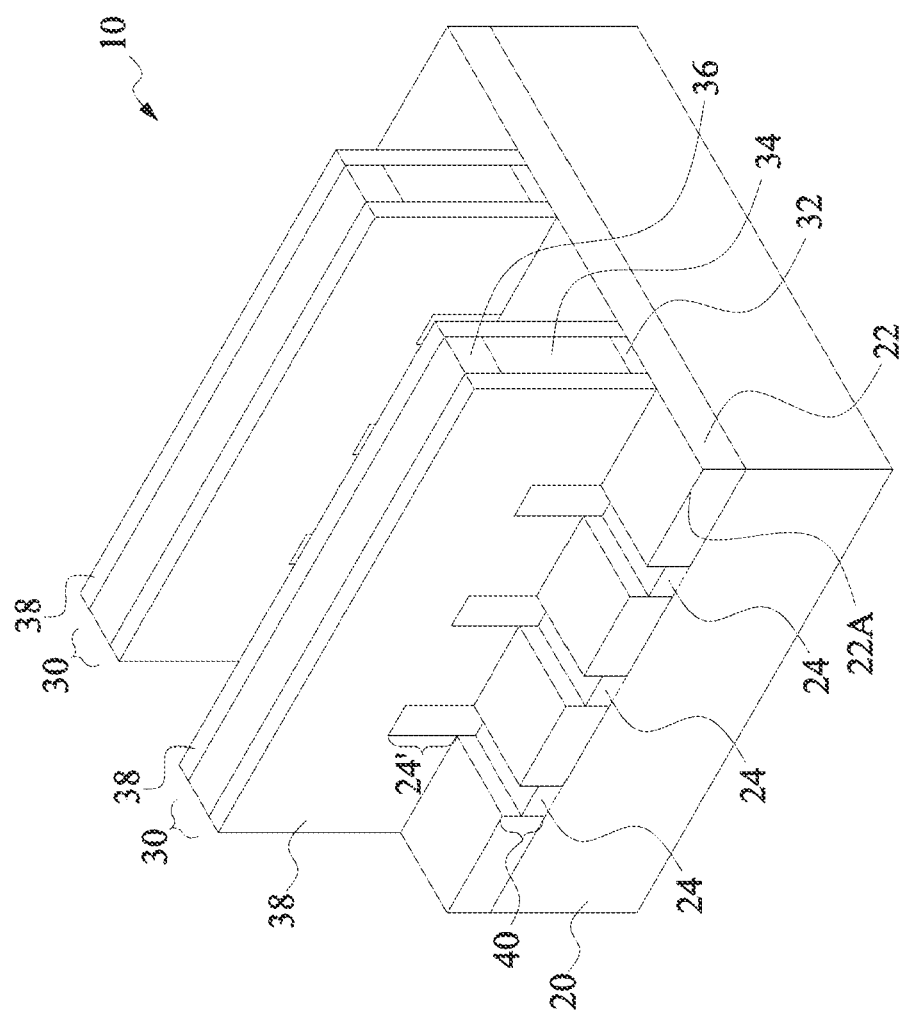

An etching step (referred to as source/drain recessing hereinafter) is then performed to etch the portions of protruding fins 24' that are not covered by dummy gate stacks 30 and gate spacers 38, resulting in the structure shown in FIG. 4. The recessing may be anisotropic, and hence the portions of fins 24' directly underlying dummy gate stacks 30 and gate spacers 38 are protected, and are not etched. Recesses 40 are accordingly formed between STI regions 22. Recesses 40 are located on opposite sides of dummy gate stacks 30. The bottom surfaces of the resulting recesses 40 may be lower than the top surfaces 22A of STI regions 22 in accordance with some embodiments.

Figure 5:
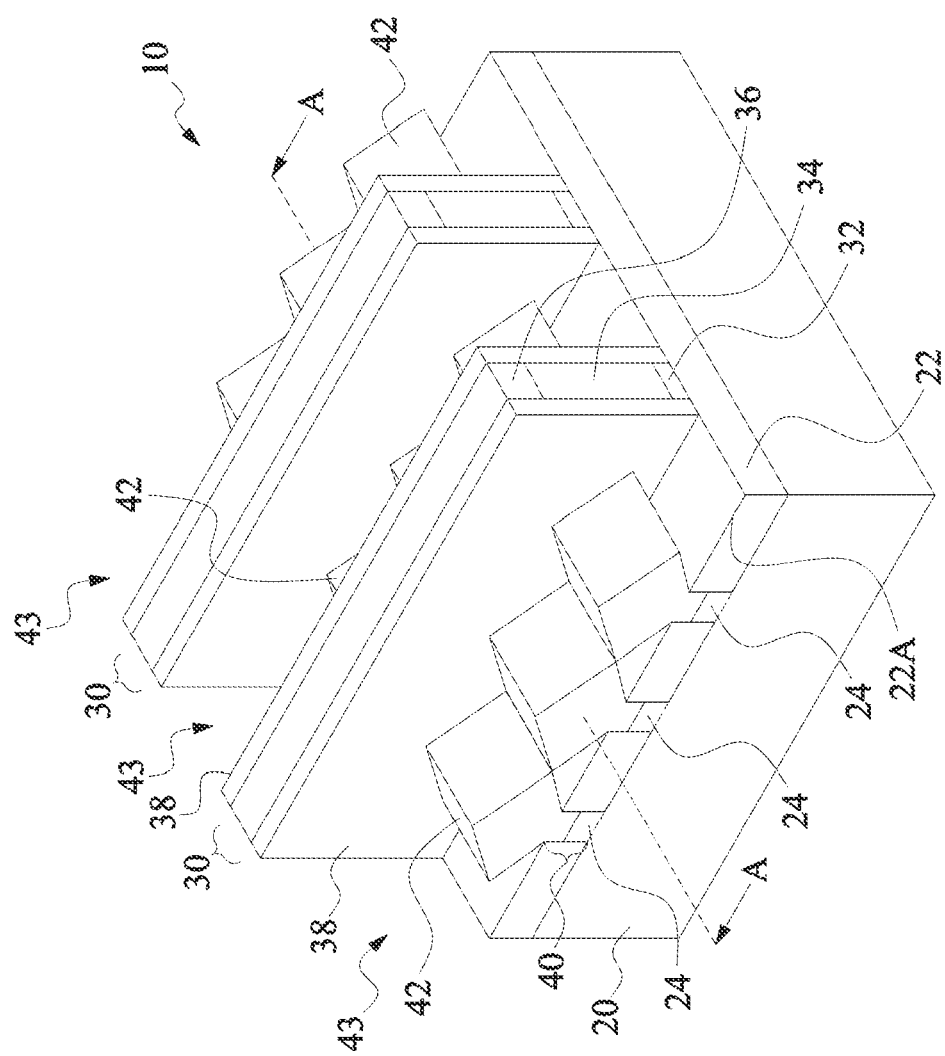

Next, epitaxy regions (source/drain regions) are formed by selectively growing a semiconductor material in recesses 40, resulting in the structure in FIG. 5. The respective step is shown as step 204 in the process shown in FIG. 21. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, the further growth of epitaxy regions 42 results in epitaxy regions 42 to expand horizontally, and facets may be formed.

Epitaxy regions 42 include lower portions that are formed in STI regions 22, and upper portions that are formed over the top surfaces of STI regions 22. The lower portions, whose sidewalls are shaped by the profiles of the respective recesses, may have (substantially) straight edges, which may also be substantial vertical edges that are substantial perpendicular to the major top and bottom surfaces of substrate 20.

FIGS. 6A, 6B, and 6C illustrate the cross-sectional views of the structure shown in FIG. 5. The cross-sectional view shown in FIG. 6A is obtained from the vertical plane containing line A-A in FIG. 5. In FIGS. 6A, 6B, 6C and subsequent figures, the figure numbers may include letter "A," "B," or "C." The letter "A" indicates that the respective figure is a cross-sectional view obtained from the same vertical plane containing line A-A in FIG. 5. The letters "B" and "C" indicate that the respective figure is obtained from a vertical plane crossing the source/drain region similar to the plane containing line B/C-B/C in FIG. 6A. Also, the device region of a figure whose figure number having the letter "B" and the device region of a figure whose figure number having the letter "C" may be different device regions. For example, the device region in the figures whose figure numbers having the letter "B" may be an N-type FinFET region, and the device region in the figures whose figure numbers having the letter "C" may be a P-type FinFET region, or vice versa. The Figures having the same digits and different letters indicate they are the different views of a same process step.

As shown in FIGS. 6A, 6B, and 6C, dummy gate stacks 30 are separated from each other by spaces/openings 43, which are also shown in FIG. 5. FIGS. 6B and 6C illustrate the cross-sectional views obtained from the plane containing B/C-B/C in FIG. 6A, except FIG. 6B illustrates the merged epitaxy regions 42, and FIG. 6C illustrates a discrete epitaxy region 42. FIG. 6B illustrates that void (air gap) 41 may be formed between neighboring epitaxy regions 42 that are in contact with each other.

Figure 7C:
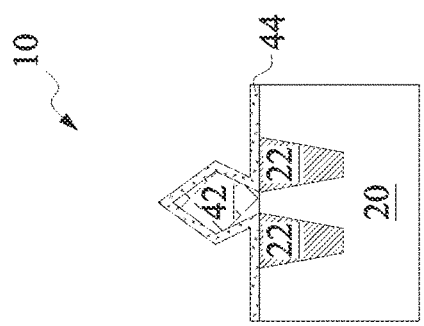
Figure 7B:
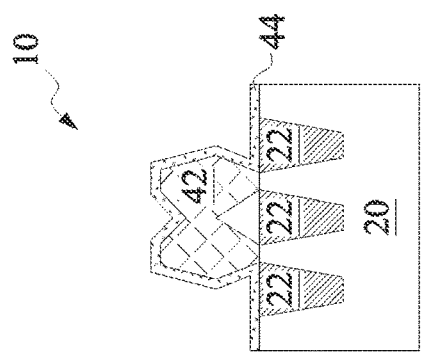
Figure 7A:
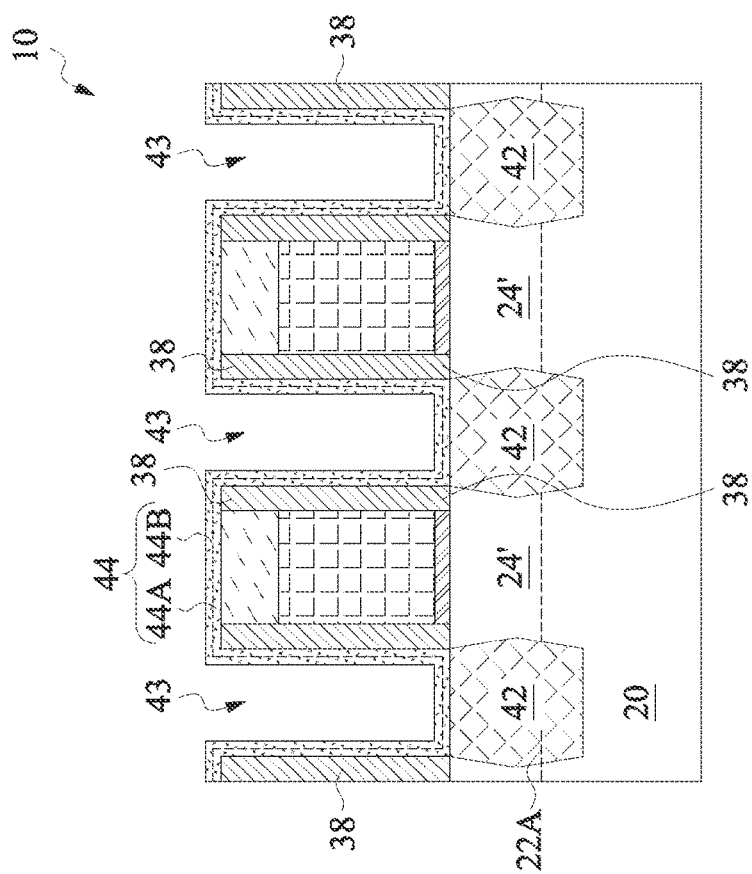

Referring to FIGS. 7A, 7B, and 7C, epitaxy mask layer 44, which is name such because it masks epitaxy regions 42, is formed as a blanket dielectric layer. The respective step is shown as step 206 in the process shown in FIG. 21. Epitaxy mask layer 44 is used to protect the underlying epitaxy regions 42, and epitaxy mask layer 44 and epitaxy regions 42 have a high etching selectivity when epitaxy mask layer 44 is removed in the subsequent process, so that the damage to epitaxy regions 42 is minimized. Epitaxy mask layer 44 is conformal, and may be formed using Atomic Layer Deposition (ALD) or Chemical Vapor Deposition (CVD). In accordance with some embodiments of the present disclosure, epitaxy mask layer 44 is formed of homogenous aluminum oxide ($Al_2O_3$). In accordance with alternative embodiments, epitaxy mask layer 44 includes sub-layers formed of different materials. For example, epitaxy mask layer 44 may include sub-layer 44A formed of aluminum oxide, and sub-layer 44B formed of silicon nitride over sub-layer 44A. As shown in FIGS. 7B and 7C, epitaxy mask layer 44 is formed conformally on semiconductor fins 24'. Due to the wavy nature of epitaxy (EPI) on multiple fins, layer 44 may be thicker within the EPI valley. This reduces the amount of sacrificial inter-layer dielectric (layer 49, FIG. 8B) within the valley, thus minimizes the need of longer/stronger etch time for the subsequent removal of layer 49.

Figure 8C:
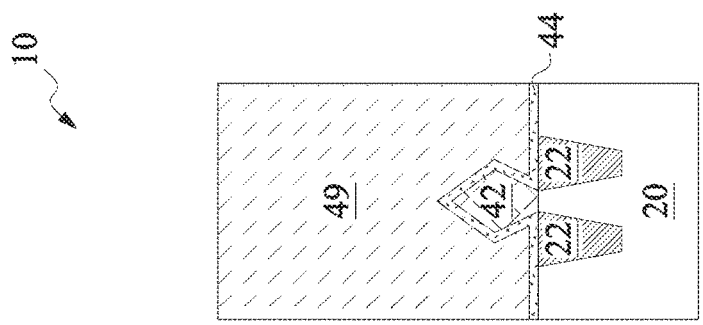
Figure 8B:
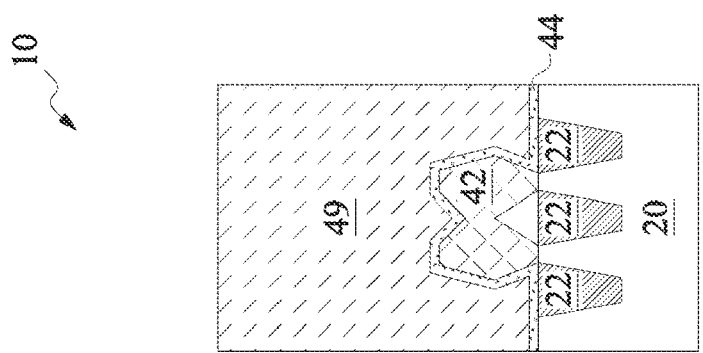
Figure 8A:
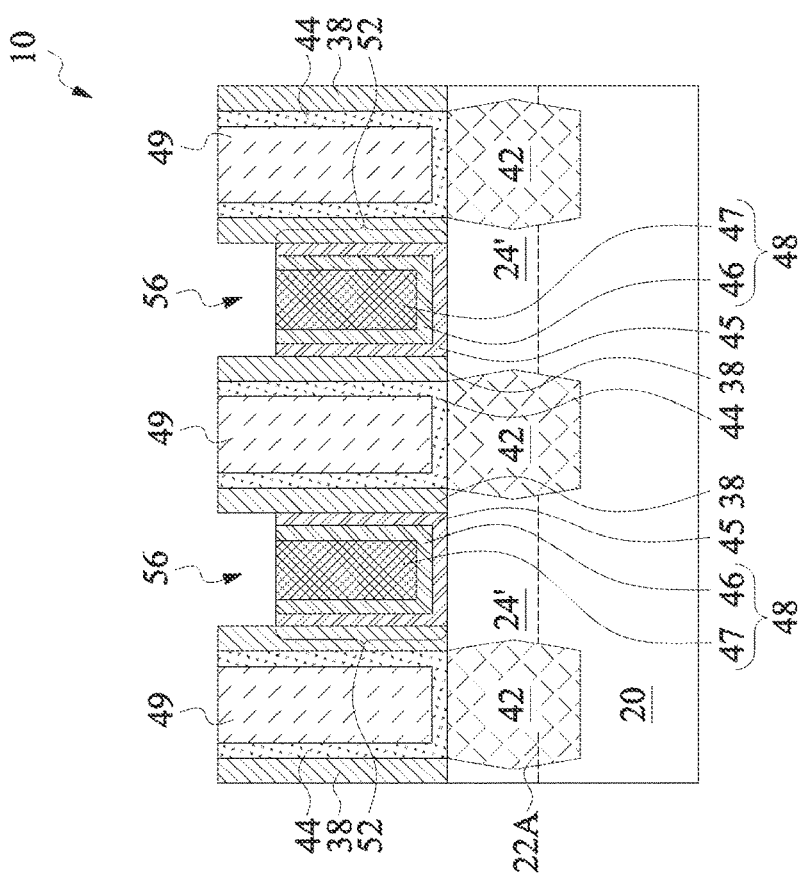

Next, sacrificial Inter-Layer Dielectric (ILD) 49 is formed to fill spaces 43, and sacrificial ILD 49 is shown in FIGS. 8A, 8B, and 8C. The respective step is shown as step 208 in the process shown in FIG. 21. Sacrificial ILD 49 may be formed of a dielectric material or any other type of material, providing it can be selectively removed in subsequent steps without damaging gate spacers 38 and epitaxy mask layer 44. In accordance with some embodiments of the present disclosure, sacrificial ILD 49 is formed of silicon oxide. Next, a planarization is performed using Chemical Mechanical Polish (CMP) or mechanical grinding so that the horizontal portions of epitaxy mask layer 44 are exposed and then removed. In a subsequent step, dummy gate stacks 30 are removed, followed by the formation of replacement gate stacks 52, which include replacement gate dielectrics 45 and metal gate electrodes 48. The resulting structure is shown in FIGS. 8A, 8B, and 8C. The respective steps are also shown as step 208 in the process shown in FIG. 21.

The formation of replacement gate stacks 52 are briefly discussed as follows. First, layers 45, 46, and 47 are formed as blanket layers. In accordance with some embodiments of the present disclosure, each of gate dielectric layers 45 includes an Interfacial Layer (IL) as its lower part. The IL is formed on the exposed surfaces of protruding fins 24', and may include an oxide layer such as a silicon oxide layer, which is formed through the thermal oxidation of protruding fins 24', a chemical oxidation process, or a deposition process. Each of gate dielectrics 45 may also include a high-k dielectric layer formed over the IL. The high-k dielectric layer is formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0.

Metal gate electrodes 48 include stacked layers 46, which are formed through deposition. The sub-layers in stacked layers 46 are not shown separately, while in reality, the sub-layers are distinguishable from each other. The deposition may be performed using a conformal deposition method such as ALD or CVD, so that the thickness of the vertical portions and the thickness of the horizontal portions of stacked metal layers 46 (and each of sub-layers) are substantially equal to each other. FIGS. 8B and 8C illustrate the cross-sectional views obtained from source/drain regions 42.

Stacked metal layers 46 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the metal gate, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

Metallic filler 47 may be formed of tungsten or cobalt, for example. After the formation of layers 45, 46, and 47, which are deposited as blanket layers, a planarization step such as CMP or mechanical grinding is performed, so that the portions of layers 45, 46, and 47 over sacrificial ILD 49 are removed. As a result, metal gate electrodes 48 are formed, which include the remaining portions of layers 46 and 47, and gate dielectrics 45 are underlying the respective metal gate electrodes 48. The remaining portion of layers 45, 46, and 47 are referred to as replacement gate stacks 52 hereinafter.

Figure 9C:
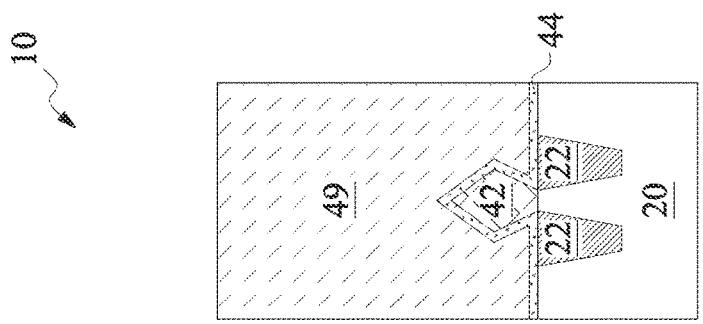
Figure 9B:
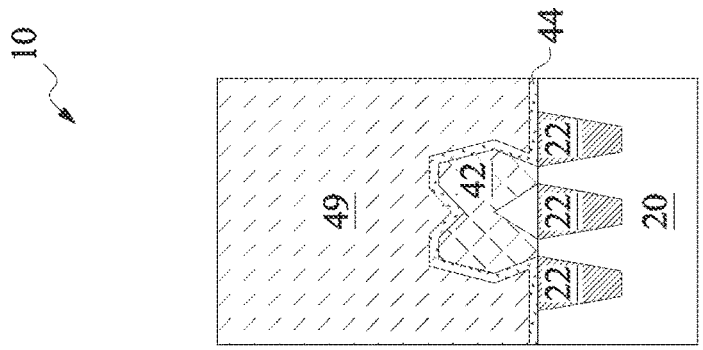
Figure 9A:
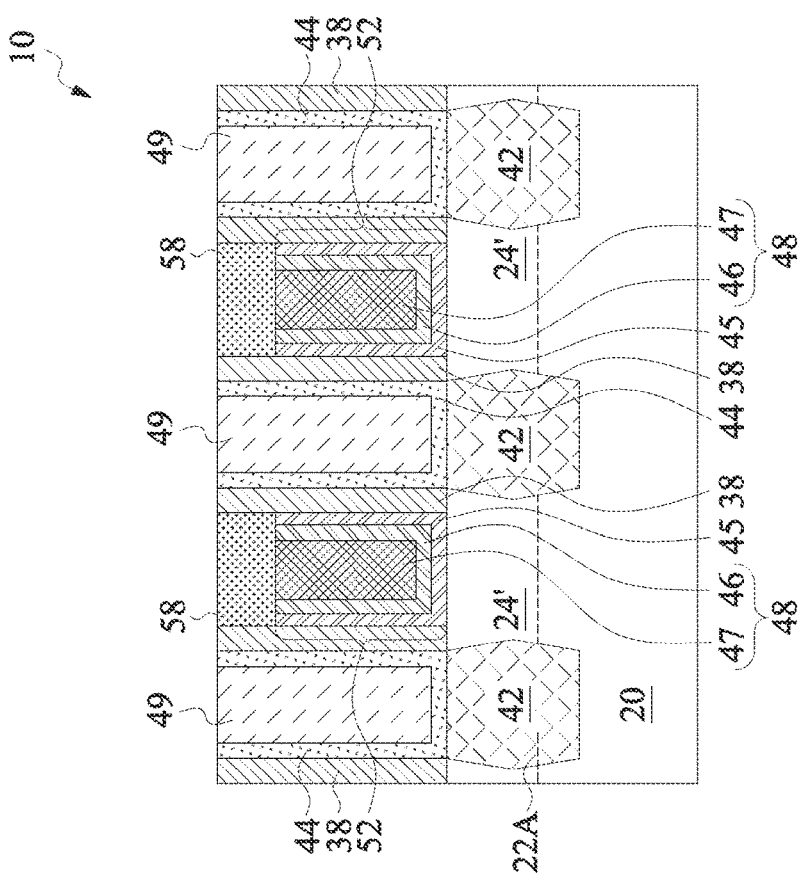

Next, replacement gate stacks 52 are recessed, forming recesses 56 as shown in FIG. 8A. The respective step is also show as step 208 in the process shown in FIG. 21. In a subsequent step, recesses 56 are filled with hard masks 58, and the resulting structure is shown in FIGS. 9A, 9B, and 9C. The respective step is shown as step 210 in the process shown in FIG. 21. In accordance with some embodiments, hard masks 58 are formed of a material selected from the same group of candidate materials for forming epitaxy mask layer 44, which may include aluminum oxide.

Figure 10C:
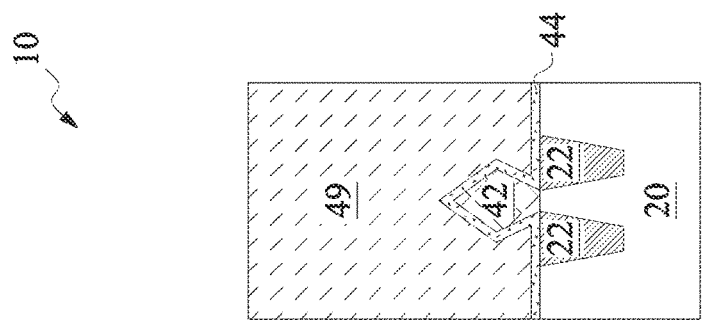
Figure 10B:
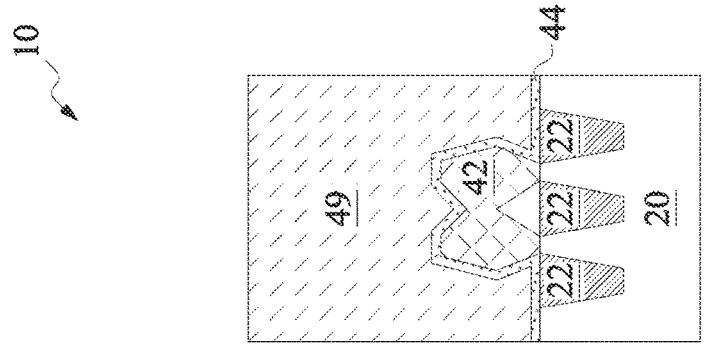
Figure 10A:
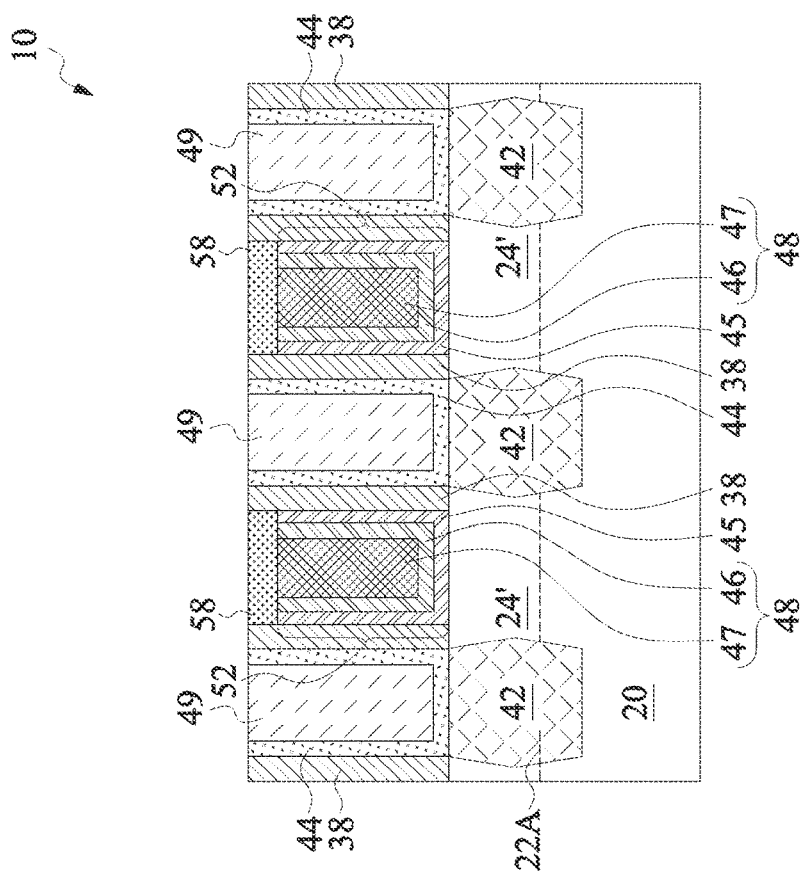

In subsequent steps, replacement gate stacks 52, which have the shape of long strips in the top view of FIG. 9A, are cut into shorter pieces (not shown), each may be used for forming one FinFET. The recesses left by the cut (removed) portions of replacement gates 52 are filled with a dielectric material (not shown, not in the illustrated plane), which is then planarized to remove the excess dielectric material. The resulting structure is shown in FIGS. 10A, 10B, and 10C, wherein hard masks 58 have been thinned by the planarization.

Figure 11C:
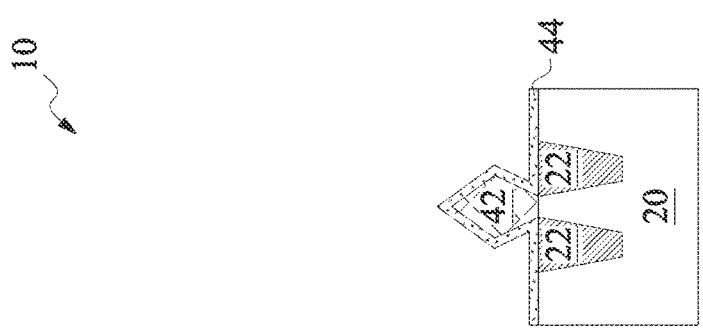
Figure 11B:
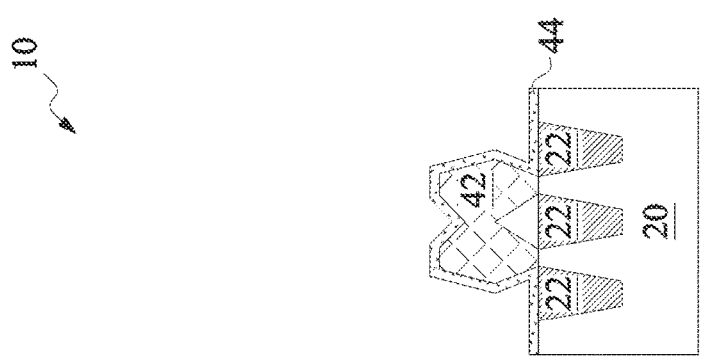
Figure 11A:
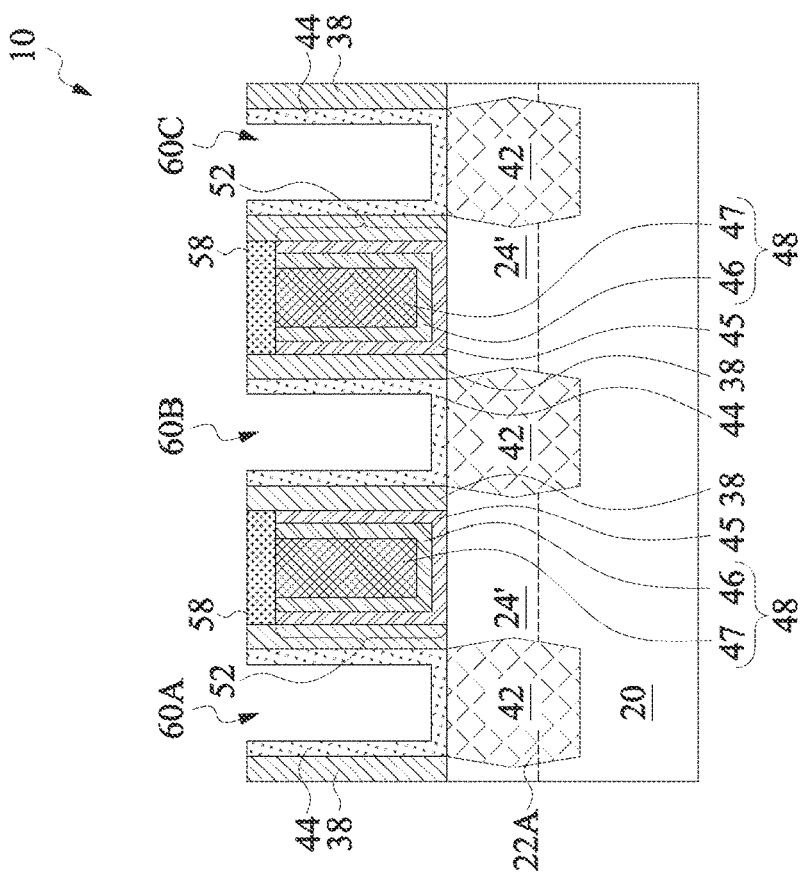

Sacrificial ILD 49 is then removed, for example, in a wet etch step. Openings 60A, 60B, and 60C are thus exposed, as shown in FIGS. 11A, 11B, and 11C. The respective step is shown as step 212 in the process shown in FIG. 21. As a result, epitaxy mask layers 44 are exposed.

Figure 12C:
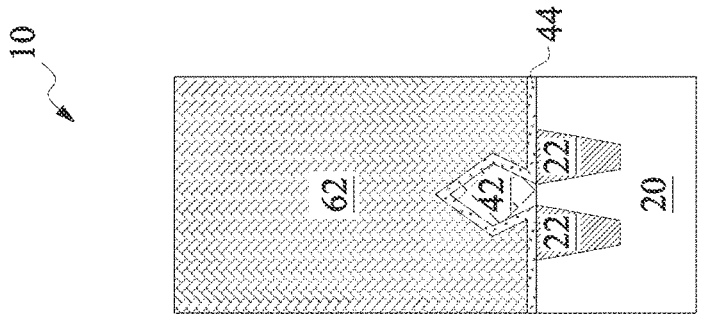
Figure 12B:
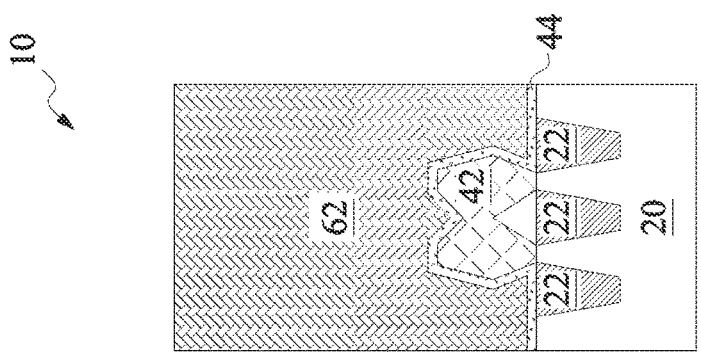
Figure 12A:
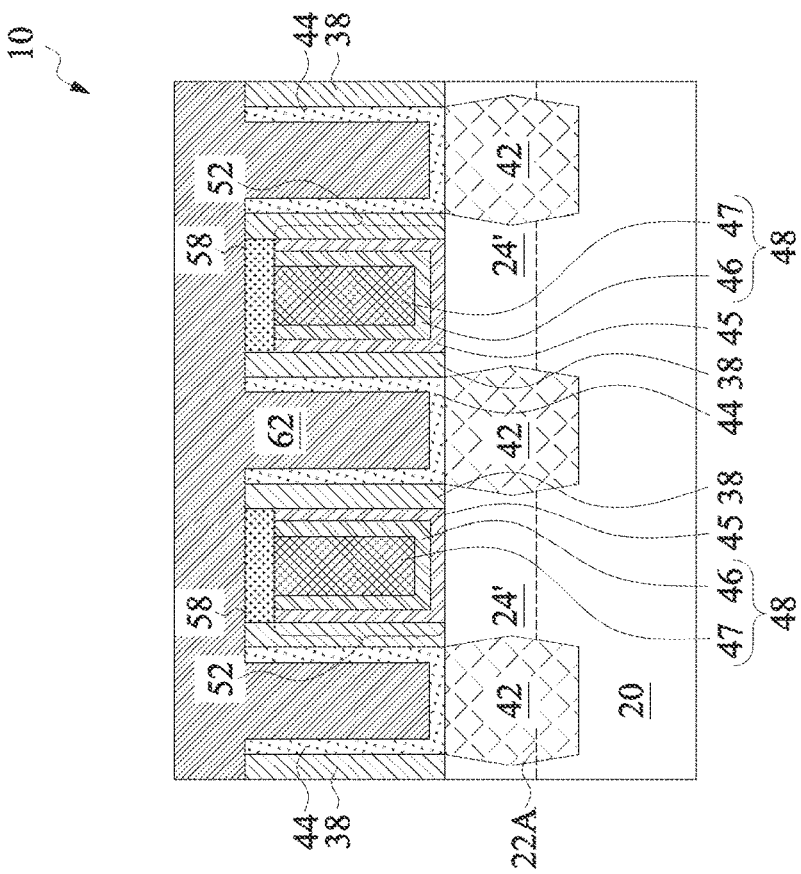

FIGS. 12A/12B/12C through 16A/16B/16C illustrate the filling of opening 60B with a filler, and openings 60A and 60C with an ILD. The respective step is shown as step 214 in the process shown in FIG. 21. Referring to FIGS. 12A, 12B, and 12C, filler 62 is filled, and a planarization step such as CMP or mechanical grinding is performed to planarize the top surface of filler 62. The top surface of the resulting filler 62 is higher than the top surfaces of hard masks 58. As shown in FIGS. 12B and 12C, filler 62 embeds epitaxy source/drain regions 42 therein. In accordance with some embodiments of the present disclosure, filler 62 is formed of amorphous silicon or polysilicon.

Figure 13C:
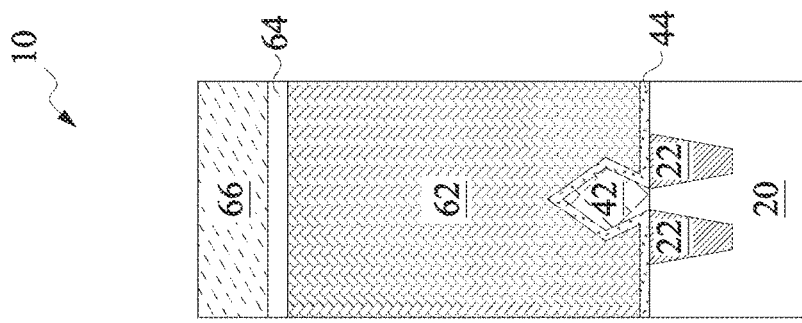
Figure 13B:
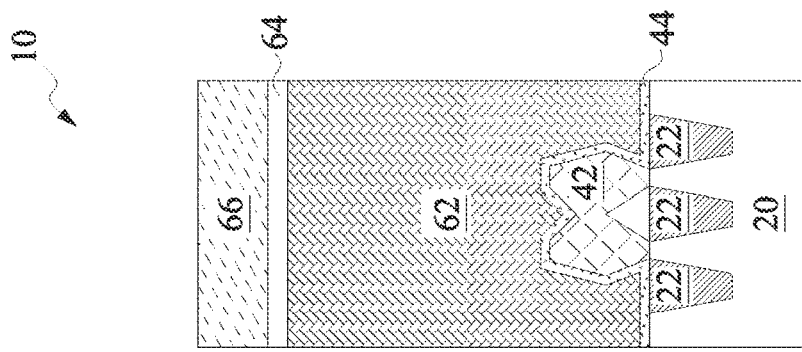
Figure 13A:
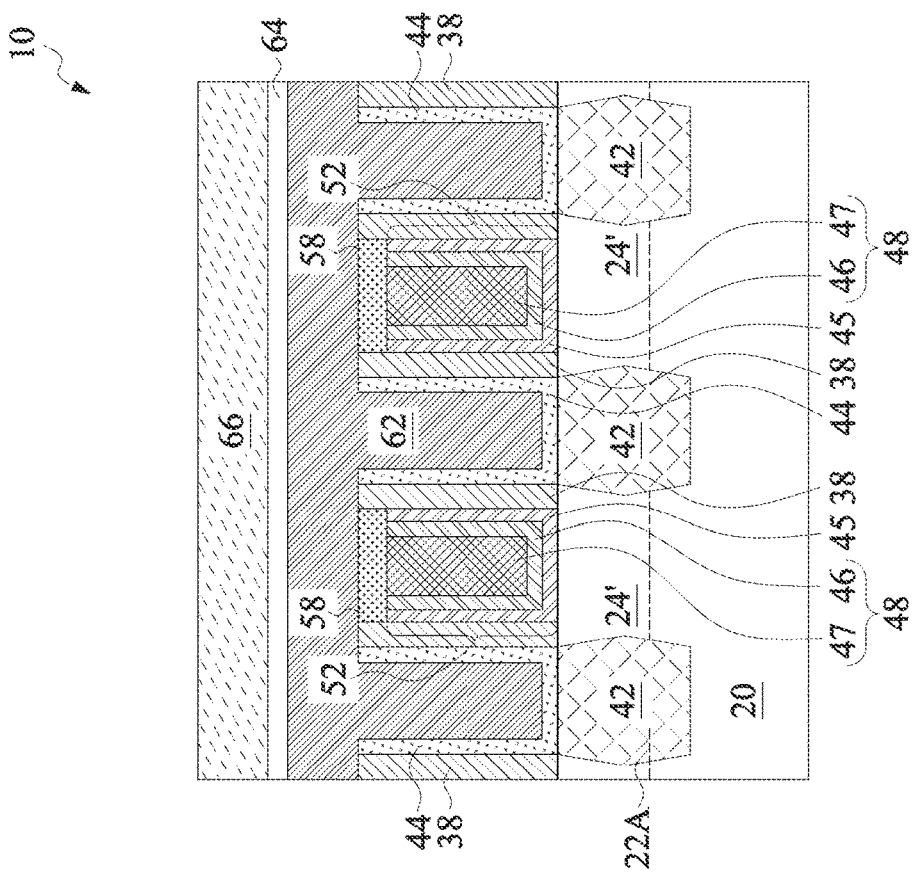

In FIGS. 13A, 13B, and 13C, pad oxide layer 64 and hard mask 66 are formed on filler 62. Pad oxide layer 64 may be formed of silicon oxide, and hard mask 66 may be formed of silicon nitride.

Figure 14C:
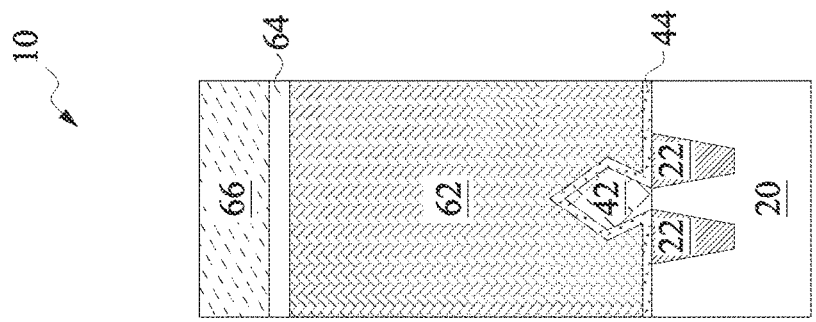
Figure 14B:
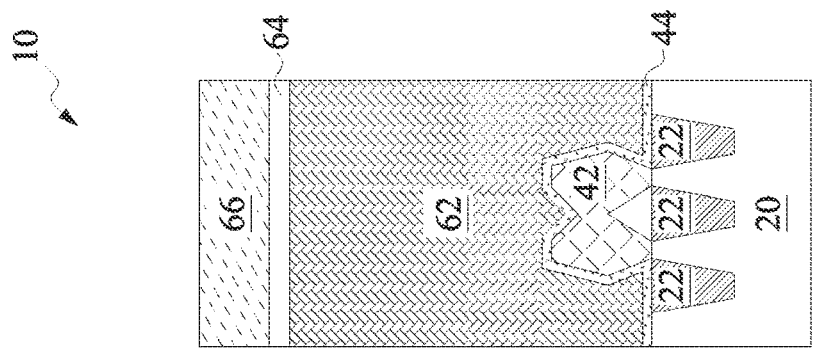
Figure 14A:
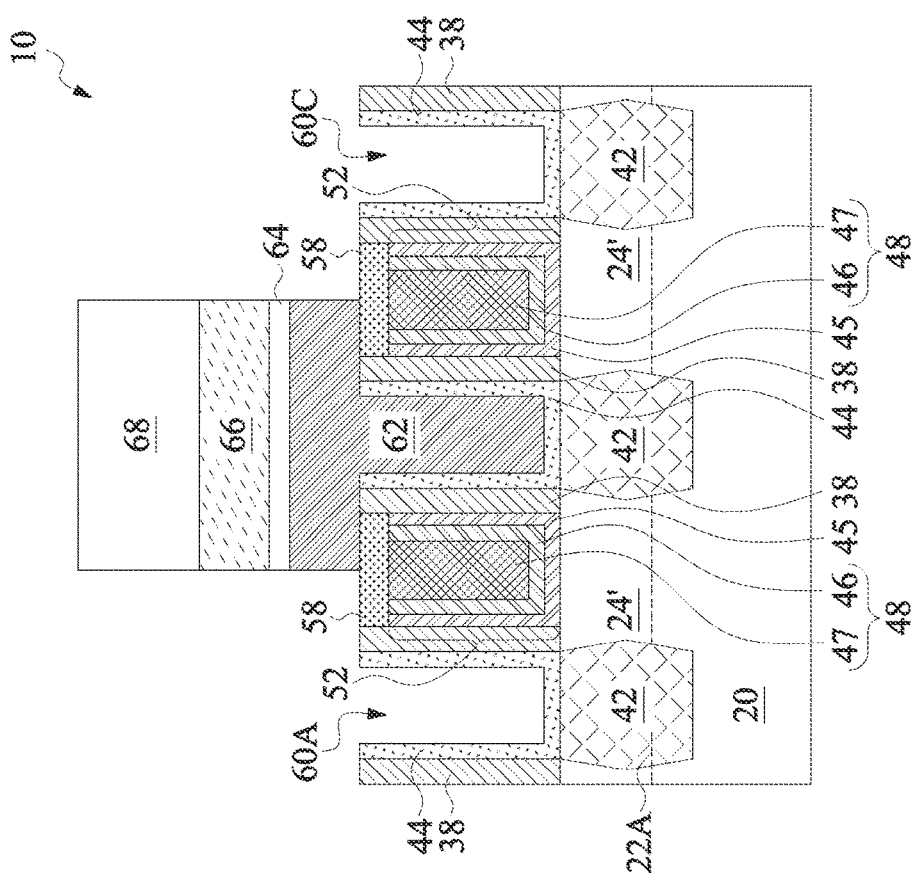

In FIG. 14A, photo resist 68 is applied and patterned, covering the portions of filler 62 in opening 60B (FIG. 11A), and leaving the portions of filler 62 in openings 60A and 60C (FIG. 13A) not covered. Hard mask 66 is then patterned, followed by the removal of photo resist 68. The patterned hard mask 66 is used to etch filler 62, so that openings 60A and 60C are revealed again, as shown in FIG. 14A. The respective step is shown as step 216 in the process shown in FIG. 21. The etching may be performed using carbon-and-fluorine-containing gases such as $CF_4$, $CH_2F_2$, $CHF_3$, or the like. Accordingly, the epitaxy mask layers 44 in openings 60A and 60C are exposed. As shown in FIGS. 14B and 14C, source/drain regions 42 remain to be covered after the etching.

Figure 15C:
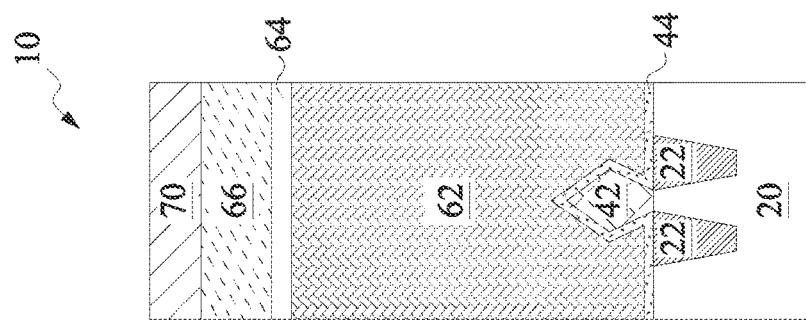
Figure 15B:
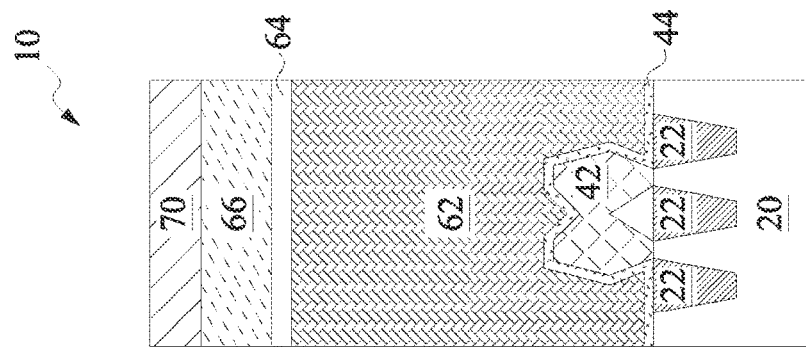
Figure 15A:
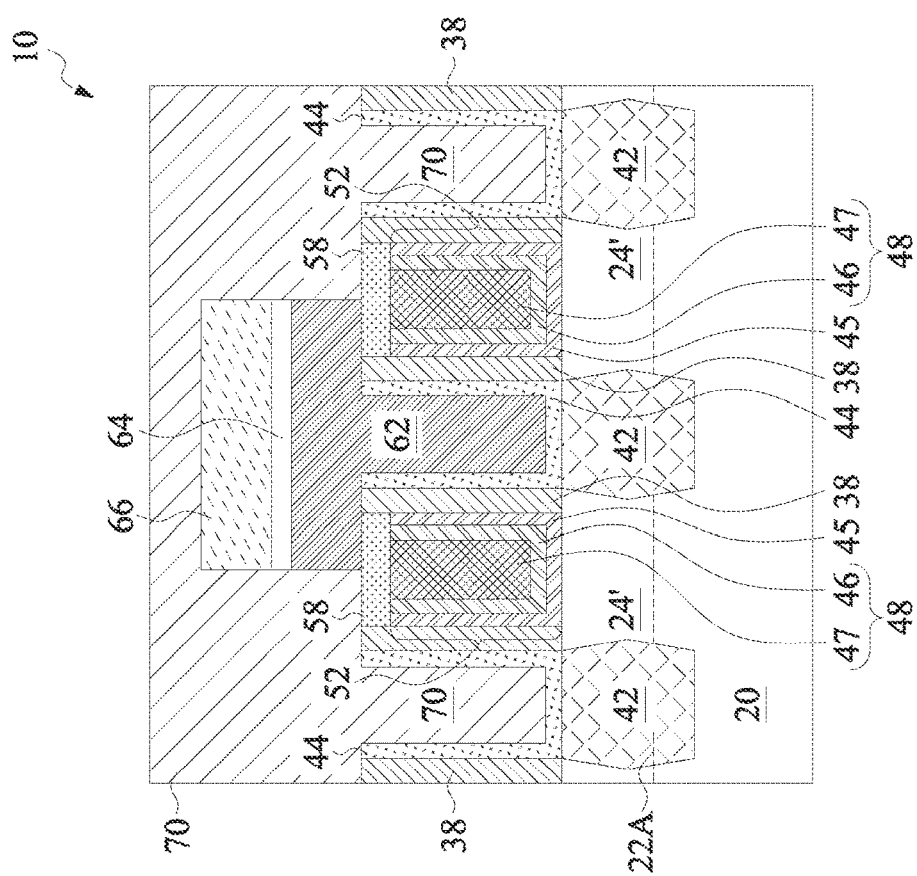
Figure 16C:
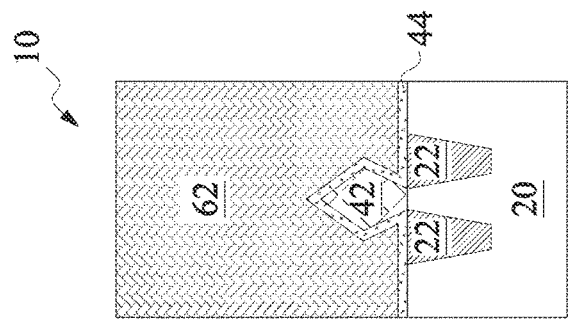
Figure 16B:
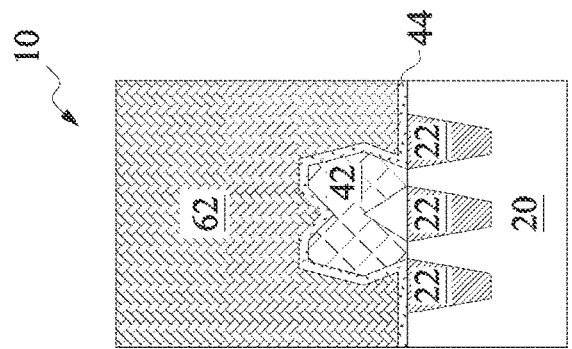
Figure 16A:
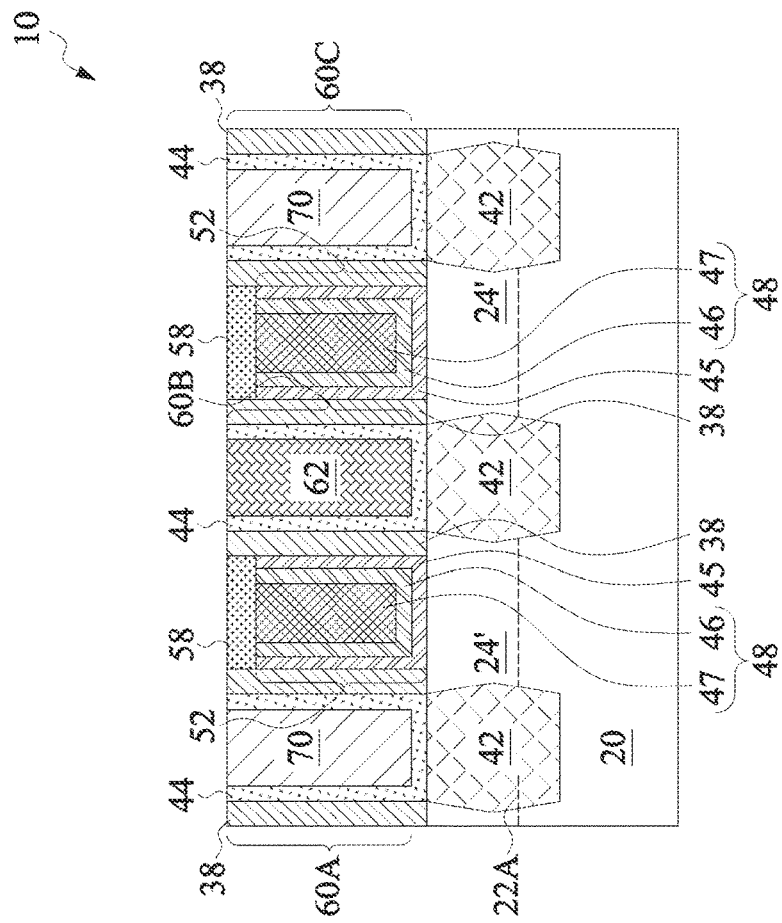

ILD 70 is then formed to fill contact openings 60A and 60C, as shown in FIGS. 15A, 15B, and 15C. The respective step is shown as step 218 in the process shown in FIG. 21. ILD 70 may include a dielectric material formed using, for example, FCVD, spin-on coating, CVD, or another deposition method. ILD 70 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. ILD 70 fully covers the remaining hard mask 66 and pad oxide 64. Next, a planarization step such as CMP or mechanical grinding is performed to remove some portions of hard mask 66, pad oxide 64, and filler 62, and the resulting structure is illustrated in FIGS. 16A, 16B, and 16C. As shown in FIG. 16A, filler 62 fills opening 60B, while ILD 70 fills openings 60A and 60C.

Figure 17C:
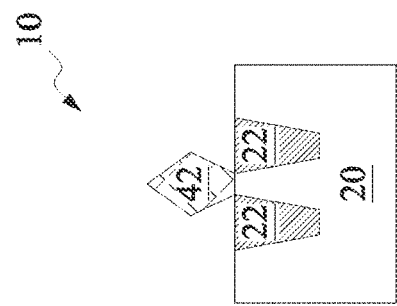
Figure 17B:
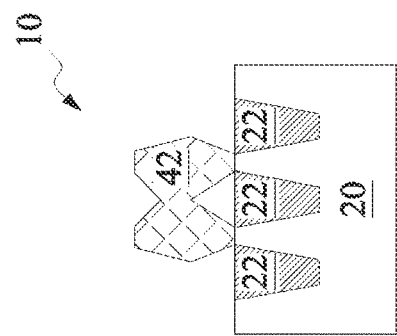
Figure 17A:
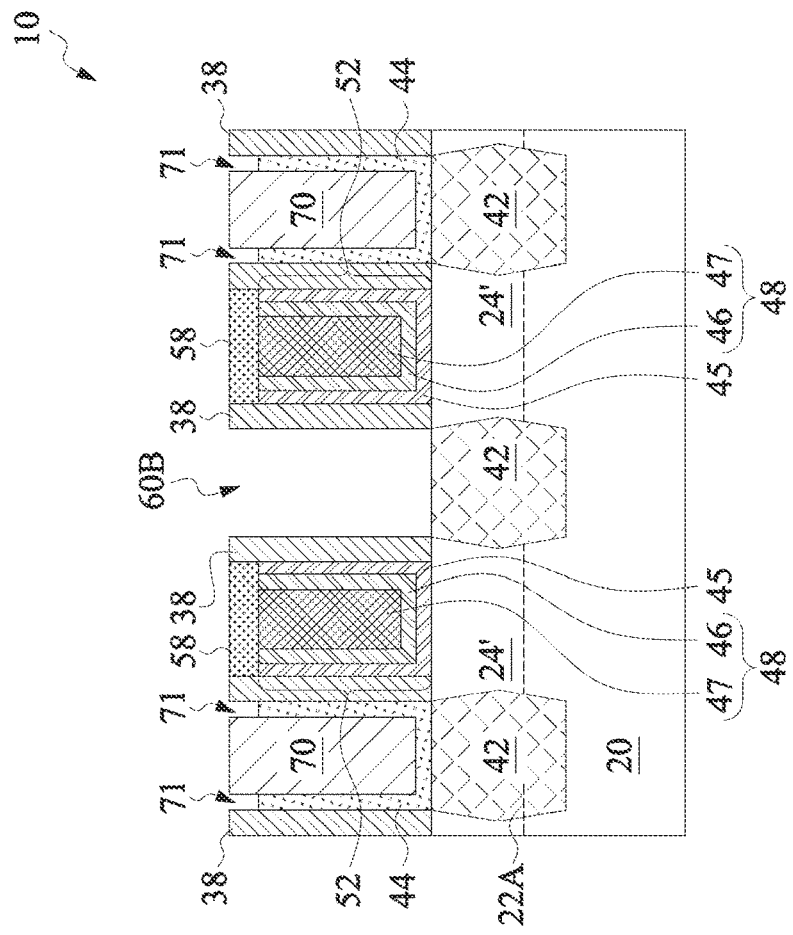

Filler 62 is then removed, for example, through wet etch using Tetra Methyl Ammonium Hydroxide (TMAH) or dry etch using a carbon-and-fluorine containing gas such as $CF_4$. The respective step is shown as step 220 in the process shown in FIG. 21. Next, the epitaxy mask 44 exposed to opening 60B is removed, and the resulting structure is shown in FIGS. 17A, 17B, and 17C. In accordance with some embodiments of the present disclosure, the removal is performed through an etching step, wherein the etching selectivity of epitaxy mask layer 44 (the ratio of the etching rate of epitaxy mask 44 to the etching rate of epitaxy regions 42) is high, for example, higher than about 20 or higher than about 50. If epitaxy mask layer 44 includes a silicon nitride layer and an aluminum oxide layer, the silicon nitride layer is removed first, followed by the removal of the aluminum oxide layer, wherein the etching selectivity of the aluminum oxide relative to epitaxy regions 42 is high. Advantageously, aluminum oxide offers a very high wet-etching-selectivity to ILD 70 (such as $SiO_2$), epitaxy regions 42 (and filler 62), so that when epitaxy mask layer 44 is removed, ILD 70 and epitaxy regions 42 are not damaged. Accordingly, epitaxy regions 42 remain to have a high topology, and are not smoothened due to the etching of epitaxy mask layer 44. In accordance with some exemplary embodiments in which epitaxy mask layer 44 is formed of aluminum oxide, it is etched using a mixture of butoxyethanol, dydroxylamine, diethylene triamine pentaacetic acid (DTPA), and water. As shown in FIGS. 17A, 17B, and 17C, epitaxy regions 42 are exposed after the etching. The portions of epitaxy mask layer 44 directly over the illustrated leftmost and right most source/drain regions 42 are also etched to form recesses 71. However, since the exposed top surfaces of epitaxy mask layer 44 are narrow, recesses 71 are shallow.

In accordance with some embodiments of the present disclosure, epitaxy regions 42 are further implanted through opening 60B with a p-type or an n-type impurity, so that the respective source/drain region 42 has an increased doping concentration. In accordance with alternative embodiments of the present disclosure, the implantation step is skipped.

Figure 18C:
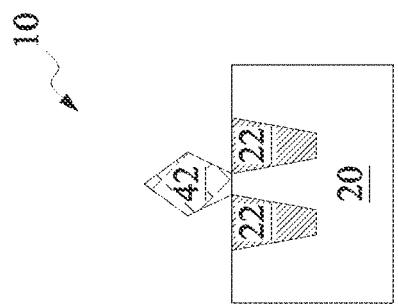
Figure 18B:
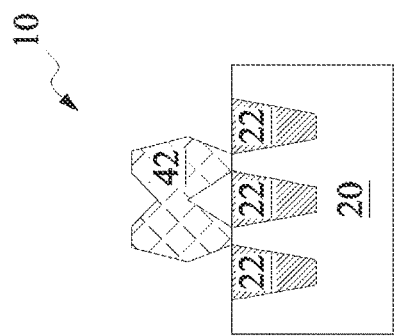
Figure 18A:
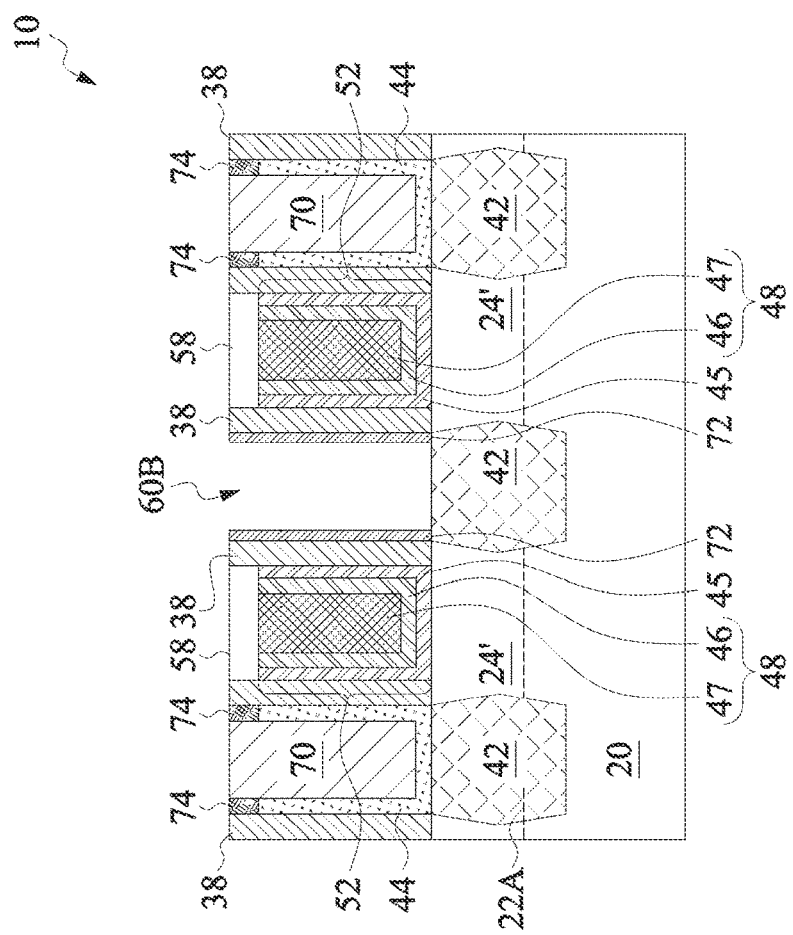

Referring to FIG. 18A, in accordance with some embodiments of the present disclosure, contact spacers 72 are formed in opening 60B. Contact spacers 72 may be formed of a high-k dielectric material (with a k value close to 3.9), so that it has good isolation ability. The candidate materials include $Al_xO_y$, $HfO_2$, SiN, and SiOCN (with no pores or substantially no pores inside). The formation of contact spacers 72 may include a conformal deposition method such as CVD or ALD to form a blanket layer. An anisotropic etch is then performed, so that the horizontal portions of the blanket layer are removed. The vertical portions of the blanket layer remaining on the sidewalls of opening 60B form contact spacers 72, which form a ring when viewed from the top of wafer 10. The same material for forming contact spacers 72 is also filled into the recesses 71 (FIG. 17A) to form spacers 74. FIGS. 18B and 18C illustrate the exposed epitaxy regions 42.

FIG. 19A illustrates the formation of silicide region 75, metal layer 76, conductive barrier layer 78, and metal region 80. In the illustrated exemplary embodiments, three epitaxy source/drain regions 42 are shown, and a source/drain contact plug is shown as being connected to the middle epitaxy source/drain regions 42. In actual process, there may also be source/drain contact plugs formed to connect to the left and right epitaxy source/drain regions 42. These source/drain contact plugs, however, are formed in different planes than illustrated, and hence are not visible.

In accordance with some embodiments, metal layer 76 (a titanium layer, for example) is deposited as a blanket layer, followed by a nitridation process on the top portion of metal layer 76 to form a metal nitride layer (78, for example). The bottom portion of metal layer 76 is not nitridated. Next, an anneal (which may be rapid thermal anneal) is performed to react the bottom portion of the remaining metal layer 76 with the top portion of source/drain region 42 to form silicide region 75. The portions of metal layer 76 on the sidewalls of contact spacers 72 are not reacted. Next, either metal nitride layer 78 is left in the final product, or the previously formed metal nitride layer 78 is removed, followed by the deposition of a new metal nitride layer (such as another titanium nitride layer, also represented using reference numeral 78) that is thinner than the removed metal nitride layer. Metal region 80 is then formed, for example, by filling tungsten, cobalt, or the like, followed by a planarization to remove excess materials, resulting in lower source/drain contact plug 82. The respective step is shown as step 222 in the process shown in FIG. 21. FIGS. 19B and 19C illustrate another cross-sectional view of lower source/drain contact plug 82.

Figure 20:
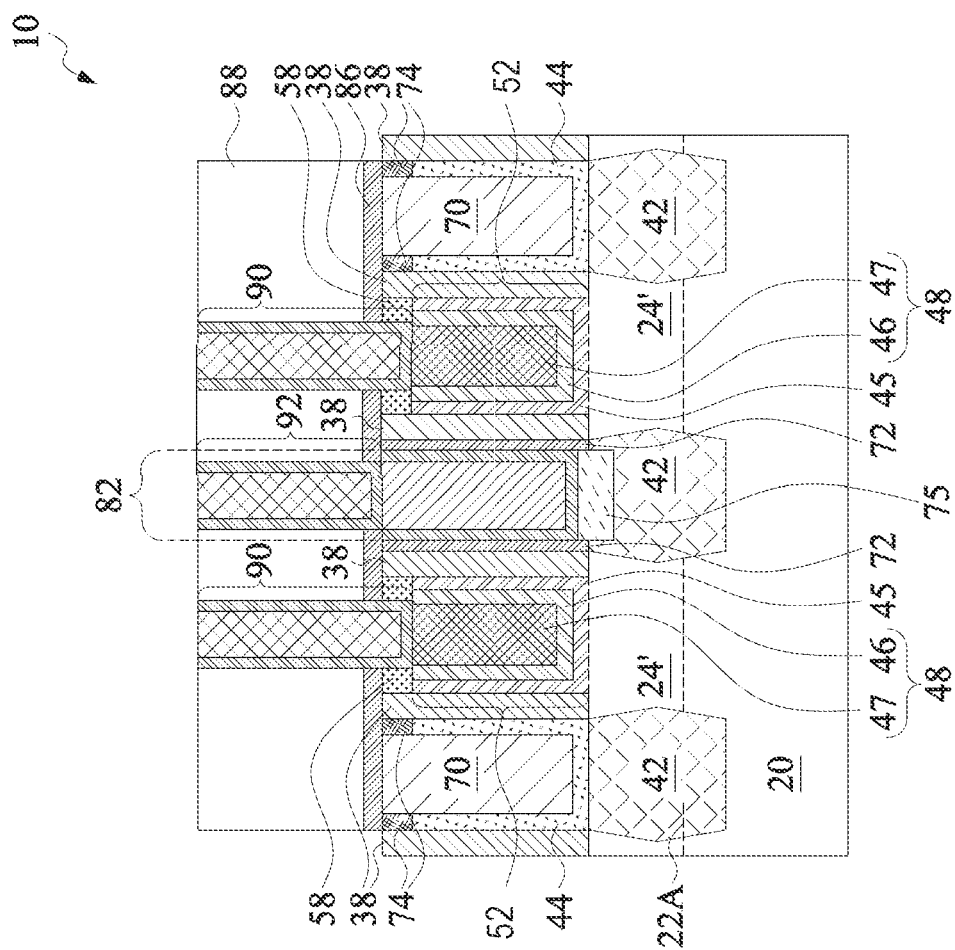
Figure 21:
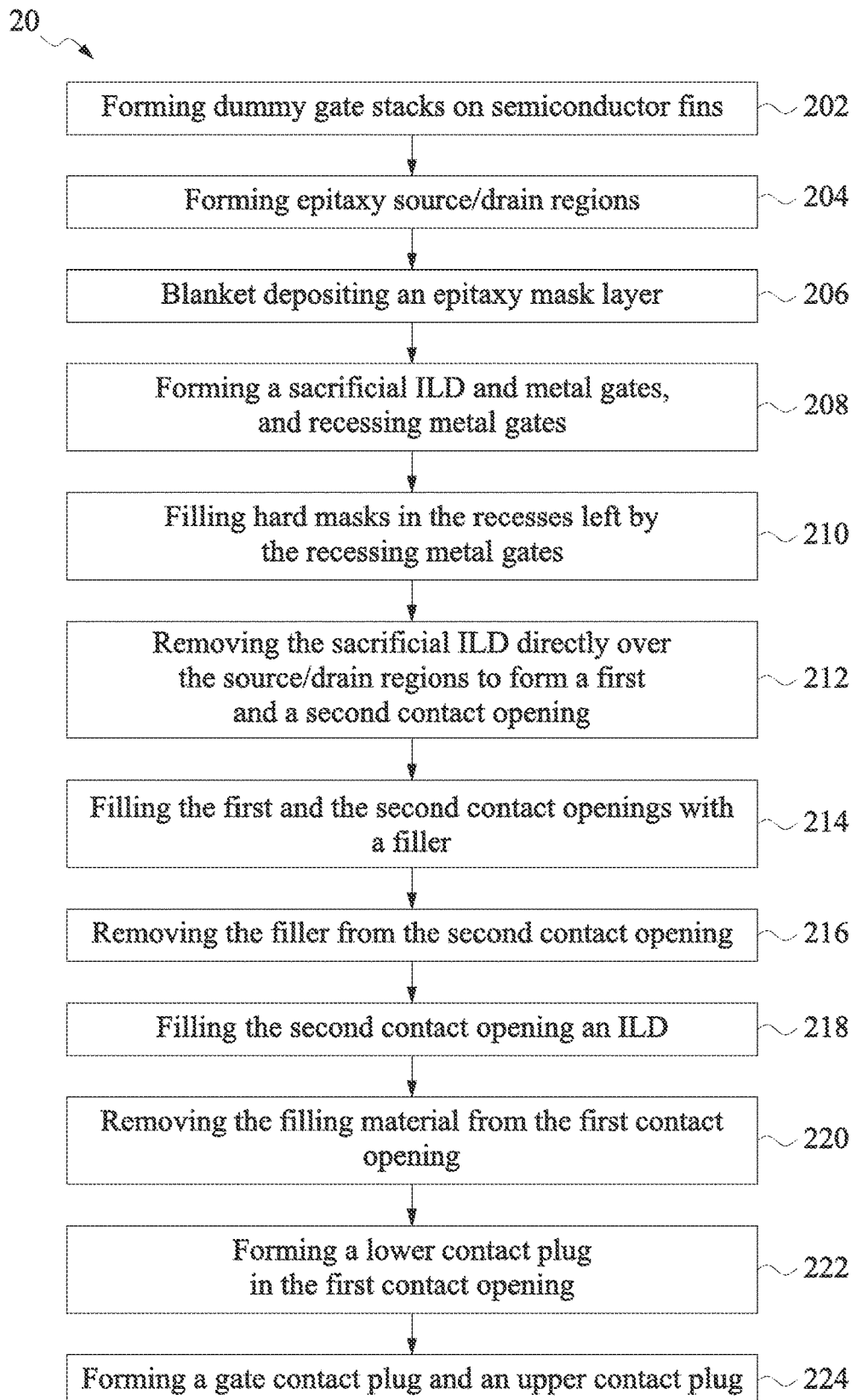
FIG. 21 illustrates a process flow for forming a transistor and contact plugs in accordance with some embodiments.

FIG. 20 illustrates the formation of etch stop layer 86, dielectric layer 88, gate contact plugs (vias) 90, and upper source/drain contact plug (via) 92 in etch stop layer 86 and dielectric layer 88. The respective step is shown as step 224 in the process shown in FIG. 21. Etch stop layer 86 may be formed of silicon carbide, silicon oxynitride, silicon carbonitride, or the like, and may be formed using a deposition method such as CVD. Dielectric layer 88 may include a material selected from PSG, BSG, BPSG, Fluorine-doped Silicon Glass (FSG), TEOS oxide, or PECVD oxide (which may include $SiO_2$). Dielectric layer 88 may be formed using spin-on coating, FCVD, or the like, or formed using a deposition method such as PECVD or Low Pressure Chemical Vapor Deposition (LPCVD).

Dielectric layer 88 and etch stop layer 86 are etched to form openings (occupied by plugs/vias 90 and 92). The etching may be performed using, for example, Reactive Ion Etch (RIE). In a subsequent step, plugs/vias 90 and 92 are formed. Gate contact plugs 90 penetrate through hard masks 58 to contact gate electrodes 48. In accordance with some embodiments of the present disclosure, plugs/vias 90 and 92 include barrier layers and metal-containing materials over the barrier layers. The formation of plugs/vias 90 and 92 may include forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride.

The embodiments of the present disclosure have some advantageous features. The epitaxy mask layer has a high etching selectivity relative to epitaxy regions, and can be removed without causing excess loss of the epitaxy regions. Furthermore, by forming a sacrificial filler to protect some portions of epitaxy mask layer in some source/drain contact openings, other portions of the epitaxy mask layer can be removed using wet etch without damaging the epitaxy mask layer. Accordingly, the epitaxy source/drain regions have minimized loss in the formation of source/drain contact openings, and the resulting contact resistance is improved.

In accordance with some embodiments of the present disclosure, a method includes forming a first and a second contact opening to reveal a first and a second source/drain region, respectively, forming a mask layer having a first and a second portion in the first and the second contact openings, respectively, forming a first and a second sacrificial ILD in the first and the second contact openings, respectively, removing the first sacrificial ILD from the first contact opening, filling a filler in the first contact opening, and etching the second sacrificial ILD. The filler protects the first portion of the mask layer from being etched. An ILD is formed in the second contact opening and on the second portion of the mask layer. The filler and the first portion of the mask layer are removed using a wet etch to reveal the first contact opening. A contact plug is formed in the first contact opening.

In accordance with some embodiments of the present disclosure, a method includes forming a mask layer extending into a space between a first dummy gate stack and a second dummy gate stack, and filling a sacrificial ILD into the space. The sacrificial ILD is over a bottom portion of the mask layer. The method further includes removing the sacrificial ILD to reveal the mask layer in the space, filling the space with a filler that is overlying the mask layer in the space, removing the filler and the mask layer to expose a source/drain region, and forming a contact plug in the space.

In accordance with some embodiments of the present disclosure, a method includes forming a mask layer extending into a space between a first dummy gate stack and a second dummy gate stack, filling a sacrificial ILD over the mask layer and into the space, removing the sacrificial ILD to reveal the mask layer in the space, and removing the mask layer from the space using wet etch. A removed portion of the mask layer includes a horizontal portion at a bottom of the space, and a vertical portion extending to a top surface of the first dummy gate stack. A contact plug is formed in the space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit device comprising:
a semiconductor region;
a gate stack on the semiconductor region;
a gate spacer comprising:
an inner sidewall contacting the gate stack; and
a first top edge;
a first source/drain region on a side of the gate stack, wherein the first source/drain region extends into the semiconductor region;
a first dielectric layer comprising a sidewall portion contacting an outer sidewall of the gate spacer, wherein the sidewall portion of the first dielectric layer comprises a second top edge lower than the first top edge;
a second dielectric layer overlapping the sidewall portion of the first dielectric layer, wherein edges of the second dielectric layer are flush with respective sidewalls of the sidewall portion of the first dielectric layer; and
a dielectric region comprising an additional sidewall contacting the sidewall portion of the first dielectric layer.

2. The integrated circuit device of claim 1, wherein the dielectric region comprises a top surface higher than the second top edge.

3. The integrated circuit device of claim 2, wherein the top surface of the dielectric region is at a same level as the first top edge.

4. The integrated circuit device of claim 1, wherein the second dielectric layer has a third top edge coplanar with the first top edge and a top surface of the dielectric region.

5. The integrated circuit device of claim 1 further comprising:
a second source/drain region on an opposite side of the gate stack than the first source/drain region;
a silicide region and a contact plug over the first source/drain region; and
a dielectric contact spacer encircling the silicide region and the contact plug, wherein the dielectric contact spacer and the second dielectric layer are formed of a same dielectric material, and have same atomic percentages of elements.

6. The integrated circuit device of claim 1 further comprising an etch stop layer over and contacting both of the gate spacer and the dielectric region, wherein the etch stop layer is spaced apart from the sidewall portion of the first dielectric layer.

7. The integrated circuit device of claim 1, wherein the first dielectric layer further comprises an additional sidewall portion on an opposite side of the dielectric region than the sidewall portion.

8. The integrated circuit device of claim 1, wherein first opposite edges of the sidewall portion of the first dielectric layer are vertically aligned to second opposite edges of the dielectric region.

9. The integrated circuit device of claim 1, wherein the first dielectric layer and the dielectric region are formed of different dielectric materials.

10. An integrated circuit device comprising:
a semiconductor fin;
a gate stack on the semiconductor fin;
a gate spacer on a sidewall of the gate stack;
a first semiconductor region extending into the semiconductor fin;
an Inter-Layer Dielectric (ILD) region overlapping the first semiconductor region; and
a dielectric layer comprising:
a bottom portion contacting a top surface of the first semiconductor region, wherein the ILD region overlaps the bottom portion;
a lower portion joined to the bottom portion; and an upper portion overlapping the lower portion, wherein both the lower portion and the upper portion are between, and in direct contact with, the gate spacer and the ILD region, and the lower portion and the upper portion form a distinguishable interface therebetween.

11. The integrated circuit device of claim 10 further comprising:
   isolation regions extending into a semiconductor substrate underlying the semiconductor fin; and
   a semiconductor strip between the isolation regions, wherein the first semiconductor region is over and joined to the semiconductor strip.

12. The integrated circuit device of claim 10, wherein the lower portion comprises aluminum oxide.

13. The integrated circuit device of claim 10 further comprising:
   a second semiconductor region on an opposite side of the gate stack than the first semiconductor region;
   a source/drain contact plug over and electrically coupling to the second semiconductor region; and
   a contact spacer having portions on opposing sides of the source/drain contact plug, wherein the contact spacer and the upper portion of the dielectric layer are formed of a same dielectric material.

14. The integrated circuit device of claim 10 further comprising:
   a hard mask over the gate stack, wherein the gate spacer further extends on an additional sidewall of the hard mask; and
   an etch stop layer over and contacting both the hard mask and the upper portion of the dielectric layer.

15. The integrated circuit device of claim 10 further comprising an epitaxy semiconductor region extending into the semiconductor fin, and wherein the bottom portion and the lower portion of the dielectric layer are formed of a same dielectric material.

16. The integrated circuit device of claim 15, wherein the bottom portion of the dielectric layer comprises an additional top surface contacting an additional bottom surface of the ILD.

17. An integrated circuit device comprising:
   a semiconductor substrate;
   isolation regions extending into the semiconductor substrate;
   a semiconductor fin protruding higher than the isolation regions;
   a gate stack on a top surface and sidewalls of the semiconductor fin;
   a gate spacer having a first sidewall contacting the gate stack, and a second sidewall opposite to the first sidewall;
   a dielectric layer comprising an upper portion and a lower portion formed of different materials, wherein both of the upper portion and the lower portion are in contact with the second sidewall of the gate spacer; and
   an Inter-Layer Dielectric (ILD) region, wherein both of the upper portion and the lower portion comprise an additional sidewall contacting the ILD region.

18. The integrated circuit device of claim 17 further comprising:
   an etch stop layer over and contacting both the gate spacer and the upper portion of the dielectric layer.

19. The integrated circuit device of claim 17, wherein the lower portion of the dielectric layer comprises aluminum oxide.

20. The integrated circuit device of claim 17, wherein the lower portion has a height greater than a height of the upper portion.

* * * * *